United States Patent [19]

Herold et al.

[11] Patent Number: 4,926,141
[45] Date of Patent: May 15, 1990

[54] FREQUENCY SYNTHESIZER WITH IMPROVED AUTOMATIC CONTROL OF LOOP BANDWIDTH SELECTION

[75] Inventors: Barry W. Herold, Boca Raton; Omid Tahernia, Coconut Creek, both of Fla.

[73] Assignee: Motorola, Inc., Schaumburg, Ill.

[21] Appl. No.: 345,866

[22] Filed: May 1, 1989

[51] Int. Cl.⁵ .................... H03L 7/085; H03L 7/107; H03L 7/18
[52] U.S. Cl. .................... 331/16; 331/1 A; 331/17; 331/25; 455/260
[58] Field of Search .................... 331/1 A, 16, 17, 25, 331/DIG. 2; 455/260

[56] References Cited

U.S. PATENT DOCUMENTS

| | | | |
|---|---|---|---|
| 4,167,711 | 9/1979 | Smoot | 331/17 |
| 4,516,083 | 5/1985 | Turney | 331/1 A |
| 4,745,372 | 5/1988 | Miwa | 331/8 |
| 4,771,249 | 9/1988 | Burch et al. | 331/17 |

OTHER PUBLICATIONS

Specification for NJ88C31, Plessey Co., Pfc, Publication No. PS 2059, May 1986.

Primary Examiner—David Mis
Attorney, Agent, or Firm—William E. Zitelli; Vincent B. Ingrassia

[57] ABSTRACT

A method of and apparatus for automatically selecting one of first and second loop bandwidth states of a phase lock loop circuit of a frequency synthesizer. The phase lock loop circuit is governed by a reference frequency signal and a feedback frequency signal to adjust the frequency of the synthesized frequency signal to a frequency channel setting. Each of the reference and feedback frequency signals include one phase indication per frequency period. The feedback frequency signal is phase and frequency representative of the synthesized frequency signal. The loop bandwidth of the phase lock loop circuit is automatically switched from the first to the second state based on an initial occurrence of three successive phase indications of a selected one of the reference and feedback frequency signals between successive phase indications of the other, and automatically switched back from the second to the first state based on an initial occurrence of two successive phase indications of the other frequency signal between successive phase indications of the selected frequency signal.

18 Claims, 6 Drawing Sheets

FREQUENCY SYNTHESIZER WITH IMPROVED AUTOMATIC CONTROL OF LOOP BANDWIDTH SELECTION

BACKGROUND OF THE INVENTION

The present invention relates to a frequency synthesizer having automatic control of loop bandwidth selection to generate a synthesized frequency signal, generally referred to as autobandwidth control, and more particularly, to an apparatus and method of operating the frequency synthesizer with improved features of autobandwidth control.

A frequency synthesizer generally includes at least one phase lock loop comprising the elements of a phase detector, charging circuit, a storage device including a capacitive element, a voltage controlled oscillator, and a frequency divider network. In operation, the phase detector is governed by a very stable reference frequency signal and a feedback frequency signal to generate at least one control signal which governs the charging circuit to source or sink current to and from a capacitive element at a current level (loop bandwidth) to adjust the voltage across the capacitive element of the storage device. The voltage controlled oscillator generates a synthesized frequency signal proportional in frequency to the adjusted voltage. The frequency divider network divides the synthesized frequency down to the feedback frequency signal.

In a programmable frequency synthesizer, the frequency of the synthesized frequency signal may be dynamically set by programming the frequency divider network with a coded digital word. Accordingly, a phase lock loop of the frequency synthesizer may be randomly switched to a new synthesized frequency signal by programming a different digitally coded word into the frequency divider network.

Each time the phase lock loop is dynamically set to generate a new synthesized frequency signal, the feedback frequency signal is caused to deviate in phase and frequency from the reference frequency signal initially and then relocked thereto within a time interval dictated by the loop bandwidth setting of the phase lock loop. In most phase lock loops, the loop bandwidth is established by setting as one variable the current level which the charging circuit uses to adjust the voltage across the capacitive element of the storage device. Most contemporary frequency synthesizers operate with two loop bandwidths or commensurate current level settings. A first or low loop bandwidth (i.e. low current level setting) is generally established to maintain lock of the synthesized frequency signal to a current synthesized frequency setting. This low setting offers filtering and stability to reduce substantially synthesized frequency jittering as a result of electrical noise either self-induced or otherwise.

However, the low current level setting is not considered adequate for relocking the current synthesized frequency signal to a new frequency setting because, in most applications, the relock time is required to be held to a minimum. Thus, for these purposes, a second or wider loop bandwidth setting may be selected in accordance with the relocking operational state of the phase lock loop.

Examples of contemporary phase lock loops having dual loop bandwidth settings are shown and described in the following U.S. Patents:

(1) U.S. Pat. No. 4,167,711 entitled "Phase Detector Output Stage for Phase Locked Loop" issued to George Smoot on Sept. 11, 1979, and (2) U.S. Pat. No. 4,771,249 entitled "Phase Locked Loop Having a Filter with Controlled Variable Bandwidth" issued to Burch et al. on Sept. 13, 1988,
both patents being assigned to the same assignee as the instant application.

More particularly, Burch et al. is directed to an autobandwidth control circuit which operates to switch automatically from the low to the high loop bandwidth state when two successive phase indications of one of the reference and feedback frequency signals occur between successive phase indications of the other frequency signal where each of the reference and feedback frequency signals include only one phase indication per frequency period. Further, the Burch autobandwidth control circuit operates to switch back from the high to low loop bandwidth state only after three frequency transitions of the feedback frequency signal about the reference frequency signal occurs.

One drawback of this type of autobandwidth controller is its sensitivity to small perturbations of phase shifts of the feedback frequency signal during "lock" which may be caused by externally coupled noise or even, internal noise which may occur in the voltage controlled oscillator. For example, in the autobandwidth control circuit of Burch et al., it does not require much phase shift during "lock" to cause a switch from low to high loop bandwidth states. Accordingly, once inadvertently switched to the high loop bandwidth state, Burch et al. requires three frequency transitions before the controller can cause a return to the proper low loop bandwidth state.

Another drawback concerns power saving, particularly when the frequency synthesizer is utilized in a battery powered electronic device. For example, this type of autobandwidth control requires high current levels through multiple transitions of frequency differences as described above before switching to a lower current level which condition imposes a heavy and undesirable drain on the battery for a not insubstantial period of time. Accordingly, these periods of heavy drain on the battery may lead to shorter battery life cycle.

These and other drawbacks are ameliorated by the present invention which includes an embodiment having an improved set of criteria for the automatic selection of loop bandwidth states. The advantages of the present invention shall become more readily apparent from the description of a preferred embodiment thereof found hereinbelow taken together with the illustrations of the drawings of the instant application.

SUMMARY OF THE INVENTION

A frequency synthesizer is governed by a frequency channel setting to generate a synthesized frequency signal and includes a phase lock loop which is operative in a first loop bandwidth state to maintain the synthesized frequency signal substantially at the frequency channel setting and operative in a second loop bandwidth state to converge the synthesized frequency signal to a new frequency channel setting. The phase lock loop circuit includes a phase detecting means governed by a reference frequency signal and a feedback frequency signal to generate at least one control signal for adjusting the frequency of the synthesized frequency signal based on said reference and feedback frequency signals. Each of the reference and feedback frequency signals includes one phase indication per frequency period. The feedback frequency signal is phase and frequency representative of the synthesized frequency signal.

In accordance with the present invention, the phase lock loop circuit further comprises an autobandwidth control means for controlling the switching from the first to the second loop bandwidth state based on an initial occurrence of three successive phase indications of a selected one of the reference and feedback frequency signals between successive phase indications of the other of the reference and feedback frequency signals, and for controlling the switching back from said second to said first loop bandwidth state based on an initial occurrence of two successive phase indications of the other frequency signal between successive phase indications of the selected frequency signal.

The present invention is further directed to a corresponding method of operating the phase lock loop circuit of a frequency synthesizer in a selected one of the first and second loop bandwidth states utilizing similar techniques as that described hereabove in connection with the autobandwidth control means.

DESCRIPTION OF THE PREFERRED EMBODIMENT

Figure 1:
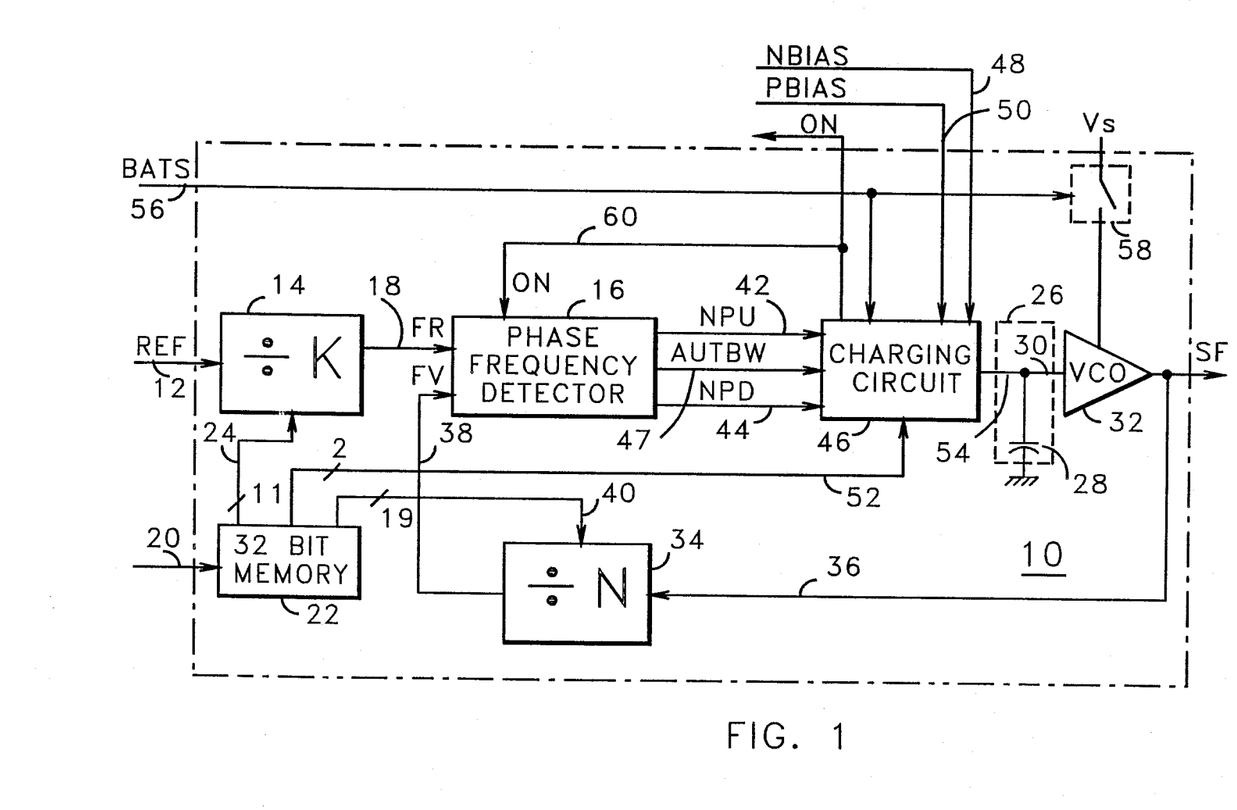
FIG. 1 is a functional block diagram schematic of a frequency synthesizer including a phase lock loop suitable for embodying the principles of the present invention.

A suitable embodiment of a frequency synthesizer including a phase lock loop 10 will be described in connection with the functional block diagram schematic depicted in FIG. 1. Referring to FIG. 1, a reference frequency signal may be conducted over signal line 12 which is coupled to a divide by K divider network 14 to develop a converted reference frequency signal FR which is conducted to a phase/frequency detector circuit 16 over signal line 18. The value of K may be programmed by a portion of a 32-bit word which may be serially provided to the loop 10 over signal line 20 and stored in a register 22. In the present embodiment, 11 bits of the 32-bit word are distributed to the network 14 over signal lines 24 for setting the value of K.

A storage device 26 which includes a capacitive element 28 is disposed in the phase lock loop circuit 10 for maintaining a voltage potential across the capacitive element 28. A signal representative of the voltage potential is conducted over signal line 30 to a voltage controlled oscillator 32 to govern the operation thereof. The oscillator 32 generates a synthesized frequency signal SF having a frequency proportional to the amplitude of the governing voltage signal 30. The synthesized frequency signal may be conducted to an input of a divide by N frequency divider circuit 34 over signal line 36. The resultant frequency divided signal which will hereinafter be referred to as the feedback frequency signal FV is coupled to another input of the phase frequency detector circuit 16 over signal line 38. The value of N of the frequency divider network 34 may be set by another portion of the 32-bit digital word stored in the register 22. In the present embodiment, 19 bits of the 32-bit digital word are distributed to the circuit 34 over the signal lines 40 for setting the value of N.

In response to the phase difference between the reference frequency signal FR and feedback frequency signal FV, the phase detector 16 generates at least one control signal. In the present embodiment, the phase detector generates control signals denoted as NPU and NPD which are conducted over signal lines 42 and 44, respectively, to a charging circuit 46. In addition, bias reference signals NBIAS and PBIAS are also conducted to the charging circuit 46 over signal lines 48 and 50. Still further, the remaining two bits of the 32-bit digital word stored in register 22 are conducted to the charging circuit over signal lines 52 and may be used as one method of setting the loop bandwidth state of the phase lock loop 10. Another method includes the generation of an autobandwidth signal, AUTBW, by the phase detector 16, which signal is conducted to the charging circuit 46 over signal line 47. This method will be described in greater detail in connection with the embodiment depicted in FIG. 2. The charging circuit 46 is coupled to the capacitive element 28 over signal line 54 to source and sink current to and from the capacitive element 28 to adjust the voltage thereacross.

Figure 2:
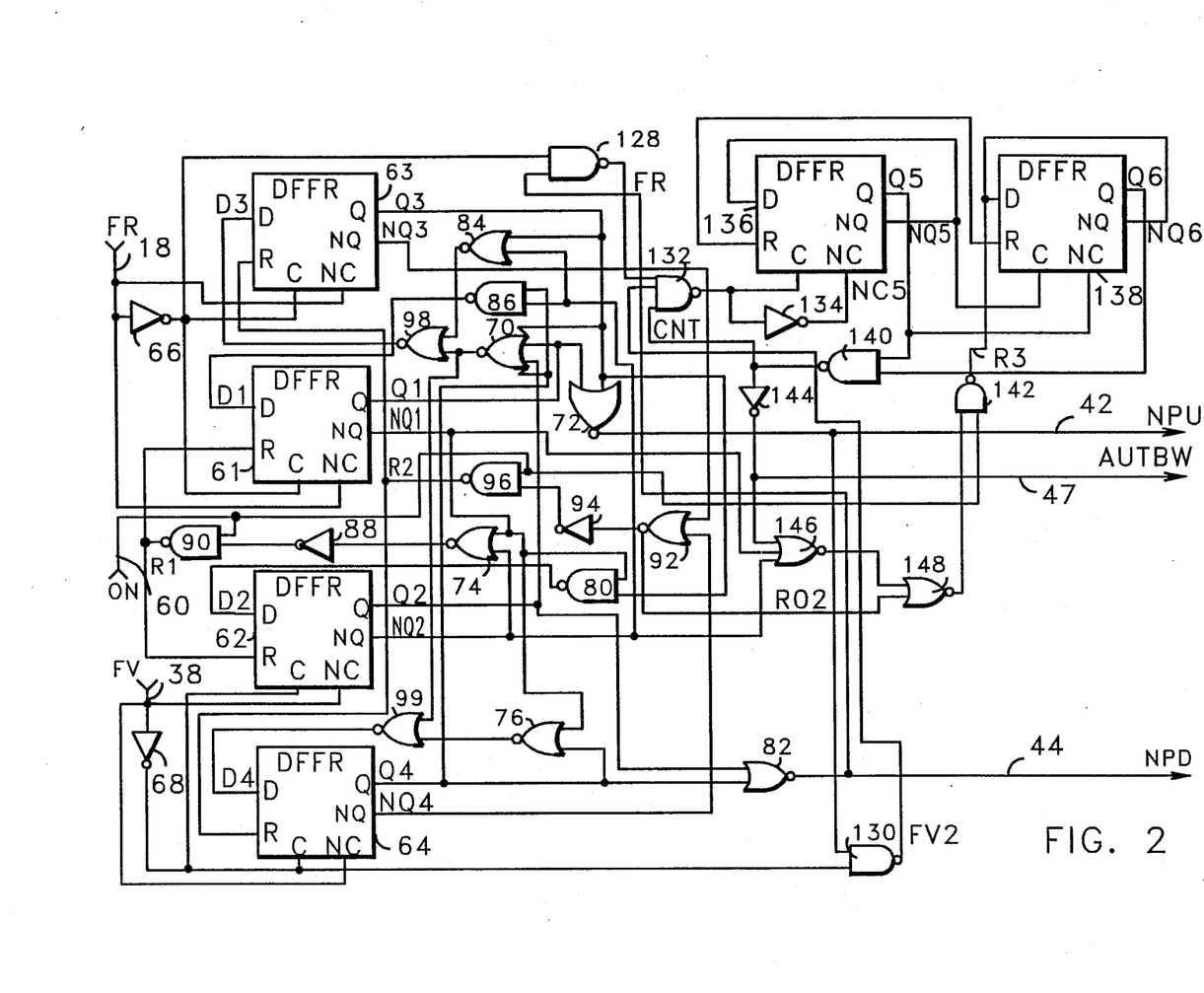
FIG. 2 is a logic schematic diagram of a phase detector circuit and autobandwidth control circuit suitable for use in the phase lock loop embodiment of FIG. 1.

A battery saving signal BATS provided over signal line 56 may be coupled to the charging circuit 46 and also to a control input of a switch 58 which is coupled between the battery source denoted as Vs and the power supply input of the voltage control oscillator 32. During sleep cycles of the signal 56, switch 58 is opened to prevent current drain from the battery source for operation of the oscillator 32, and conversely, during awake cycles, the switch 58 is closed to power the oscillator 32 from the battery source Vs. As will be described in greater detail hereinbelow, the charging circuit 46 operates in response to the battery saving signal 22 to generate a signal ON over signal line 60 which is conducted to the phase detector circuit 16. An embodiment of a phase detector circuit suitable for use in the frequency synthesizer described in connection with the embodiment of FIG. 1 is depicted by the logic circuit schematic of FIG. 2. Referring to FIG. 2, the phase detector circuit comprises four D-type flip-flops 61-64 which generate logical outputs Q1-Q4, respectively, and their complements NQ1-NQ4, respectively. Each of the reference and feedback frequency signals include a phase indication which may be, for the present embodiment, a short pulse in each of the frequency periods thereof. For example, the short pulse may appear at the zero crossing at phase zero of each of the frequency periods.

In the present embodiment, the reference and frequency signals are coupled through respective inverter gates 66 and 68 to effect their respective complement signals. The reference frequency signal and its complement are coupled respectively to the clock inputs C and NC of the flip-flops 61 and 63. Similarly, the feedback frequency signal and its complement are coupled respectively to the clock inputs C and NC of the flip-flops 62 and 64.

Continuing, the Q1 signal is coupled to one input of both NOR gates 70 and 72 and the NQ1 signal is coupled to one input of both NOR gates 74 and 76 and also to one input of NAND gate 80. The signal Q2 is coupled to the other input of NOR gate 70 and also to one input of NOR gate 82 and the NQ2 signal is coupled to the other input of NOR gate 74, one input of a NOR gate 84 and also to one input of a NAND gate 86. The output of NOR gate 74 is coupled through an inverter gate 88 to one input of a NAND gate 90, and the other input thereof is coupled to the ON signal 60. The output of the NAND gate 90, referred to as the reset signal R1, is coupled to reset inputs of the flip-flops 61 and 62.

Continuing on with the embodiment of FIG. 2, the signal Q3 is coupled to another input of the NOR gates 70, 72, and 84 and also coupled to another input of the NAND gate 80. Also, the signal Q4 is coupled to another input of the NOR gates 70, 76, and 82 and also coupled to another input of the NAND gate 86. Still further, the signals NQ3 and NQ4 are coupled to respective inputs of a NOR gate 92, the output of which being coupled through an inverter gate 94 to one input of a NAND gate 96. The other input of the NAND gate 96 is coupled to the ON signal 60. The output of the NAND gate 96, referred to as the reset signal R2, is coupled to the reset inputs of the flip-flops 63 and 64. Still further, the data inputs of the flip-flops 61 and 62 are coupled respectively to the outputs of the NAND gates 86 and 80.

Continuing, the output of the NOR gate 70 is coupled to one input of both NOR gates 98 and 99, and the other inputs thereof are coupled respectively to the outputs of the NOR gates 84 and 76. The data inputs of the flip-flops 63 and 64 are coupled respectively to the outputs of the NOR gates 98 and 99. Finally, the NOR gates 72 and 82 effect the signals NPU and NPD, respectively, over the signal lines 42 and 44. This concludes the description of the circuit embodiment for the phase detection portion of the functional block 16. A description of operation thereof will be described herebelow in connection with the state diagram of FIG. 3.

Figure 3:
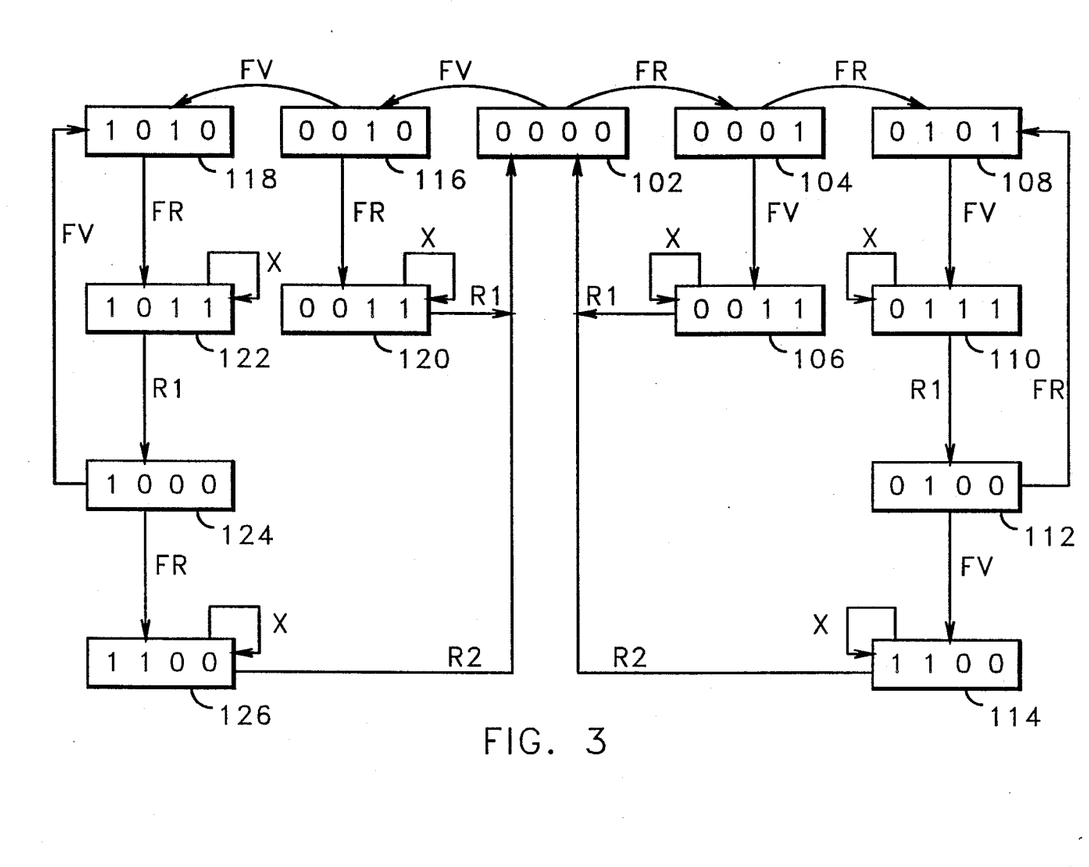
FIG. 3 is a functional state flow diagram suitable for use in describing the phase/detector circuit depicted in FIG. 2.

Referring to FIG. 3, each rectangular block represents the state of the Q1-Q4 outputs of the respective flip-flops 61-64 as described in connection with the circuit embodiment of FIG. 2. The status of the Q1-Q4 outputs are denoted in binary fashion as either being a logical 0 or a logical 1. In each rectangular block of FIG. 3, the binary state of Q4, Q3, Q2, and Q1 are shown correspondingly from left to right. The arrowed lines connecting the state blocks indicate the occurrence of a phase indication of the designated one of the reference and feedback frequency signals or the designated one of the reset signals R1 and R2.

As shown in FIG. 3, state block 102 represents the all logical 0 state of the flip-flops 61-64. Receiving a pulse or phase indication from the reference frequency signal FR sets Q1 of the flip-flop 61 and moves the state flow to the block 104. Should a phase indication or pulse be received from the feedback frequency signal FV before a phase indication or pulse is received from the reference frequency signal FR, Q2 is set to a logical 1 and the state flow moves to block 106.

In state 106, both Q1 and Q2 are logical 1's and thus the complements thereof are both logical 0's. The combination of logical elements 74, 88, and 90 respond to the logical state 106 to effect the reset signal R1 which resets the signals Q1 and Q2 of flip-flops 61 and 62 to a logical 0 state, thus returning the state flow to block 102.

However, during the state 104, should a pulse be received from the signal FR before a pulse is received from the signal FV, Q3 is set to a logical 1 and the state flow moves to block 108. While in state 108, should a pulse be received from the signal FR before a pulse is received from the signal FV, the autobandwidth signal AUTBW is caused to change in logical state from a 0 to a 1 which causes the switching of the loop bandwidth states from low to high. This operation will be described in greater detail in connection with the remaining circuitry of the embodiment of FIG. 2 hereinbelow. Conversely, while in state 108, should a pulse be received from the signal FV before a pulse is received from the signal FR, the signal Q2 is set to a logical 1 and the state flow is moved to block 110. Once again, because the logical states of Q1 and Q2 are both 1, the reset signal R1 is produced to reset Q1 and Q2 to logical 0's which moves the state flow to the block 112.

Continuing, while in the state 112, should a pulse be received from the signal FR before a pulse is received from the signal FV, the signal Q1 is set to a logical 1 and the state flow turns to state 108. Conversely, if signal FV produces a pulse before signal FR, the signal Q4 is set to a logical 1 and the state flow moves to block 114. In state 14, since both Q4 and Q3 are logical 1's and the complements thereof are logical 0's, the reset signal R2 is effected by the combination of logical elements 92, 94, and 96 and this causes the signals Q3 and Q4 to be reset to logical 0's which returns the state flow to block 102. Incidentally, the arrowed line denoted with a small X shown at the blocks 106, 110, and 114 indicates a pulse received from either signal FR or signal FV will not alter the state thereof, and only the reset signals R1 and R2 will change the states of their respective blocks.

Continuing with the state flow diagram of FIG. 3, a duplicate operation in phase detection occurs for the case when a pulse is received from the signal FV before a pulse is received from the signal FR while in the state 102, except that instead of the signal Q1 being set, the signal Q2 is set as shown by the state block 116. Also, with two successive pulses of signal FV being received before a pulse from signal FR, the state flow moves to block 118 in which Q4 is set to a logical 1 instead of Q3 as described in connection with block 108. However, should a pulse be received from signal FR while in either block 116 or 118, state flow is transferred to blocks 120 or 122, respectively. In either case, only the generation of the reset signal R1 can move the state flow from the states 120 and 122 to the states of 102 and 124, respectively. Similarly, if the next pulse is received from the signal FV while in state 124, the state flow moves to block 118 and conversely, if the next pulse is received from signal FR, state flow is transferred to block 126 wherein both signals Q3 and Q4 are logical 1's which effects the reset signal R2 to return the state flow to the block 102.

The undescribed circuit portion of the embodiment of FIG. 2 will now be described in connection with one aspect of the present invention. Referring to FIG. 2, the outputs of the inverter gates 66 and 68 which are the complements of the signals FR and FV are coupled respectively to one input of the NAND gates 128 and 130. The other input of the NAND gates 128 and 130 are coupled respectively to the control signals NPD and NPU and the outputs thereof are coupled to respective inputs of a NAND gate 132. The output of NAND gate 132 and its complement via inverter gate 134 are coupled to the clock inputs C and NC, respectively, of a D-type flip-flop 136. The output of flip-flop 136, referred to as Q5, is coupled to one clock input NC of another D-type flip-flop 138 and to one input of a NAND gate 140. In addition, the complement output of flip-flop 136, referred to as NQ5, is coupled back to the data input thereof and also to a clock input C of the flip-flop 138.

Still further, the output of flip-flop 138 referred to as Q6, is coupled to another input of the NAND gate 140, and the complement thereof is coupled back to the data input of flip-flop 138. Reset inputs of flip-flops 136 and 138 are coupled commonly to the output of a NAND gate 142 which is referred to as the reset signal R3. The output of NAND gate 140 is coupled to another input of NAND gate 132 and also coupled through an inverter gate 144 to effect the autobandwidth signal AUTBW which is coupled to the charging circuit 46 over signal line 47 (see FIG. 1). The autobandwidth signal is also coupled to one input of NOR gate 146 which has two other inputs coupled respectively to the signals NQ1 and NQ2 and its output coupled to one input of another NOR gate 148. Another input of NOR gate 148 is coupled to the output of the NOR gate 92 which is referred to as the reset signal R02. The output of NOR gate 148 along with the signal ON are coupled to respective inputs of the NAND gate 142.

In operation, one of the signals FR and FV is selected by the NAND gates 128 and 130 as governed by the respectively coupled control signal NPD and NPU to be counted in the flip-flops 136 and 138 which are arranged as a 2-bit counter. When either one or both of the signals Q5 and Q6 are a logical 0, the output of the decoder NAND gate 140 is set to a logical 1 which enables the NAND gate 132 to cause counting of the gated pulses of the selected NAND gate 128 or 130 by the flip-flops 136 and 138 concurrently, the autobandwidth signal AUTBW is set to a logical 0 by the inverter 144 which causes the loop bandwidth to be set to the low state and also enables the NOR gate 146. While in this state, should both of the signals NQ1 and NQ2 be logical 0's as described in connection with the states 106, 110, 120, and 122 of the state flow diagram of FIG. 3, the output of the NOR gate 146 is set to a 1 which logical state is conducted through the NOR gate 148 to cause the output of the NAND gate 142 to reset the flip-flops 136 and 138, thereby resetting the counter operation to an initial state of both 0's. This generally occurs when pulses from the signals FR and FV are received in succession as described in connection with blocks 106 and 120 of FIG. 3 or a pulse is received from one of the signals FV and FR prior to three successive pulses of the other frequency signal as shown by the blocks 110 and 122 of FIG. 3. This condition is also shown by the timing waveforms of the diagram of FIG. 4 at 160 and 162.

Figure 4:
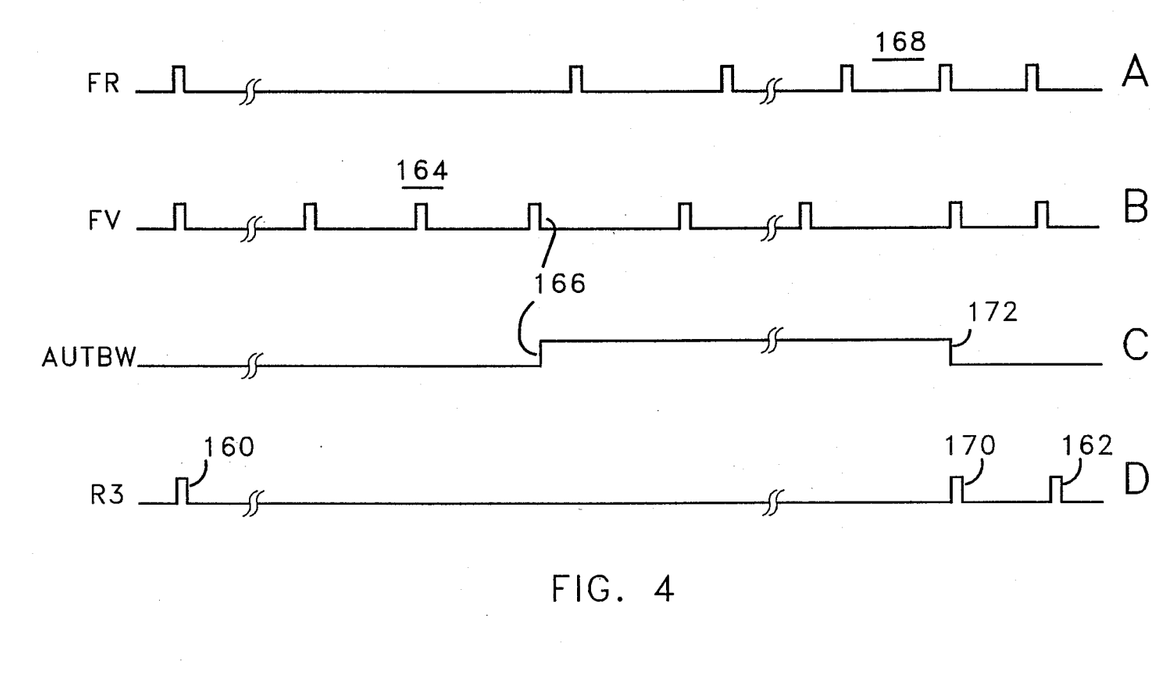
FIG. 4 includes illustrative timing waveforms A-D suitable for use in describing the operation of the autobandwidth control circuit of FIG. 2.

Continuing the description of operation, referring to both FIGS. 2 and 4, should three successive pulses or phase indications be received from one of the frequency signals FR and FV, say FV, for example, between successive pulses of the other frequency signal, say FR, for example, as shown at 164 in the timing waveforms of FIG. 4, then on the third pulse in succession, the signals Q5 and Q6 are both set to a logical 1 which occurrence is decoded by the NAND gate 140 to disable further counting by the flip-flops 136 and 138 via disablement of NAND gate 132. The NAND gate 140 also by detecting an initial occurrence of three phase indications beyond the initial count of a logical 0 sets the autobandwidth signal AUTBW to a logical 1 which causes the loop bandwidth to be switched from a low to a high state. This event is illustrated at 166 in the timing waveforms of FIG. 4 and will be described in greater detail herebelow in connection with the embodiment of the charging circuit 46 (see FIGS. 5A and 5B). Still further, while in this state, NAND gate 140 disables NOR gate 146 from resetting the counter stages 136 and 138 with the signals NQ1 and NQ2.

Since the counting stages 136 and 138 are rendered unresponsive to the pulses of the selected frequency signal during the state in which the autobandwidth signal is set to a logical 1, the state is maintained until two successive phase indications or pulses are initially received from the other frequency signal between successive pulses of the one or selected frequency signal as illustrated at 168 in the timing waveforms of FIG. 4. Under these conditions, the state flow diagram of FIG. 3 resides in the states 114 or 126, as the case may be, wherein both Q3 and Q4 are logical 1's and the complements thereof are logical 0's. NOR gate 92 responds to the signals NQ3 and NQ4 by generating the reset signal R02 which is conducted through NOR gate 148 and NAND gate 142 to effect the reset signal R3 which resets the outputs Q5 and Q6 of the counter stages 136 and 138, respectively. The generation of the reset signal R3 under these conditions is shown at 170 in the timing waveforms of FIG. 4. Accordingly, the reset states of Q5 and Q6 are decoded by the NAND gate 140 which sets the autobandwidth signal to a logical 0, as shown at 172 in FIG. 4, which causes switching from a high to low loop bandwidth status. Concurrently, the NAND gate 140 enables the stages 136 and 138 of the counter to again count via NAND gate 132 and also enables the NOR gate 146 to effect resetting of the counter stages 136 and 138 by the signals NQ1 and NQ2 as described above.

In summary then, when three phase indications or pulses are initially received from a selected one of the signals FR and FV between successive pulses of the other as governed by the control signals NPU and NPD, the autobandwidth signal is changed in logical state to cause a switching of the loop bandwidth from a low to a high state. The high loop bandwidth state is sustained until two successive pulses of the other of the signals FR and FV are initially received between successive pulses of the one or selected frequency signal, which state causes the counter stages 136 and 138 to be reset to logical 0's. In response, the autobandwidth signal is set to a logical 0 which causes the loop bandwidth to be switched from the high state to the low state. The remaining paragraphs herebelow pertain to the description of a suitable embodiment of a charging circuit which is depicted in the circuit schematics of FIGS. 5A and 5B.

Figure 5A:
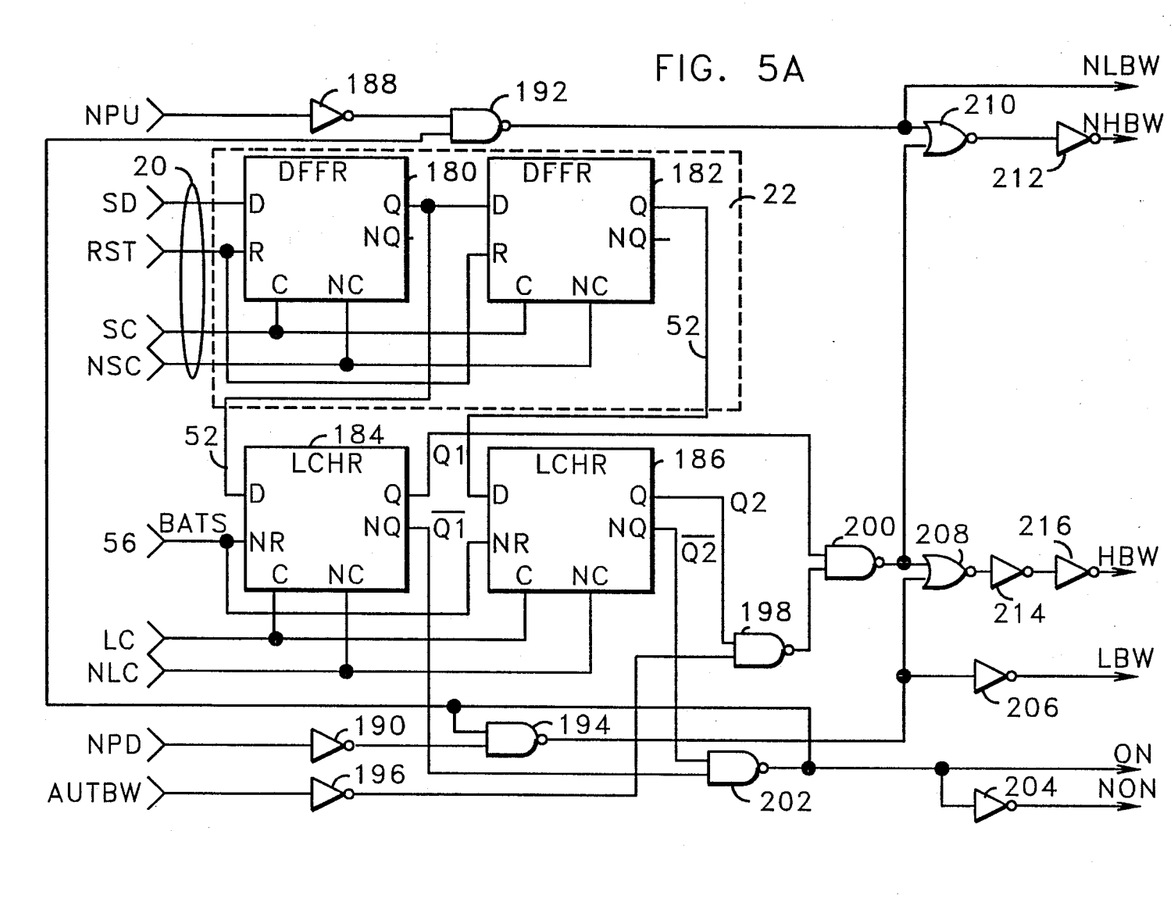
FIGS. 5A and 5B depict, in combination, a circuit schematic of a charging circuit suitable for use in the phase lock loop embodiment of FIG. 1.

The charging circuit 46 may be considered as divided into two parts, one being a logical control section and the other being an analog charging section. FIG. 5A depicts a suitable embodiment of the logical control section. A section of the memory 22 containing the two bits of information which are conducted over signal lines 52 to the charging circuit 46 is depicted in FIG. 5A for completeness. D-type flip-flops 180 and 182 are included in the memory section 22 to store the two bits of data which may be used alternatively to govern the selection of the low and high loop bandwidth states (i.e. current levels) in lieu of the autobandwidth signal AUTBW. Control commands which are coupled over signal lines 20 may include a serial data path SD for providing serial digital data to the D-type flip-flops 180 and 182. In addition, complementary clocking signals SC and NSC may be part of the signal lines 20 and used to clock the D-type flip-flops 180 and 182 in order to store the serial digital data provided over line SD. Still further, a reset signal RST may be provided as part of the control commands to reset the flip-flops 180 and 182.

The digital data bits 52 which may be alternatively used to set the loop bandwidth state (current levels) are conducted to corresponding D-type latches 184 and 186. In addition, the battery saver signal BATS over signal line 56 may be coupled to a reset input of each of the latches 184 and 186. Still further, complementary clocking signals LC and NLC may be coupled to the flip-flops 184 and 186 to provide control for the storage of the respective digital bits therein. The stored digital data bits of flip-flops 184 and 186 will hereinafter be referred to as Q1 and Q2, respectively, and their complements will hereinafter be referred to as $\overline{Q1}$ and $\overline{Q2}$.

Referring to FIG. 5A, the control signals NPU and NPD supplied from the phase detector 16 to govern the sourcing and sinking of current to the capacitive element 52 are coupled respectively through inverter gates 188 and 190 to one input of NAND gates 192 and 194, respectively. The autobandwidth signal AUTBW is coupled through an inverter gate 196 to one input of another NAND gate 198. Another input of the NAND gate 198 is coupled to the signal line of Q2. The signal line of Q1 is coupled to one input of another NAND gate 200 which has another input thereof coupled to the output of the NAND gate 198. The signal lines of $\overline{Q1}$ and $\overline{Q2}$ are coupled to two inputs of a NAND gate 202, the output of which effecting the signal ON which is coupled through an inverter gate 204 to effect the complement NON thereof. The signal ON may be coupled to the other input of the NAND gates 192 and 194 and also coupled to the phase detector circuit 16 for control thereof as governed by the battery saving signal BATS.

The output of NAND gate 194 is coupled through an inverter gate 206 to effect a control signal LBW and also coupled to one input of a NOR gate 208. In addition, the output of the NAND gate 200 is coupled to another input of the NOR gate 208 and to an input of another NOR gate 210. Still further, the output of the NAND gate 192 effects a control signal NLBW and is coupled to the other input of the NOR gate 210. Finally, the output of the NOR gate 210 is coupled through an inverter gate 212 to produce another control signal NHBW, and the output of the NOR gate 208 is coupled through a pair of cascaded inverter gates 214 and 216 to effect still another control signal HBW. The control signals NLBW, NHBW, HBW, and LBW are used in the charging circuit 46 to control MOSFET switches for the sourcing and sinking of current over signal line 54 to the storage capacitor 28 to adjust the voltage thereacross.

Figure 5B:
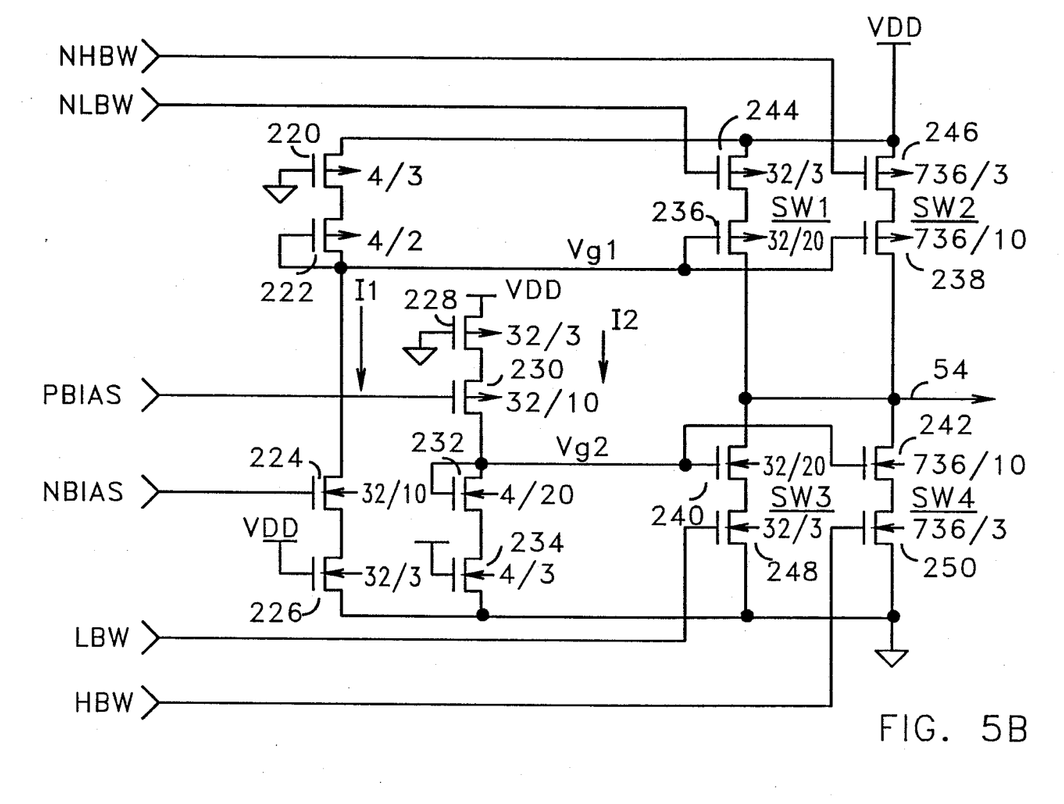

More specifically, referring to FIG. 5B which depicts a suitable embodiment of the analog changing section, MOSFET transistors are constructed in a circuit arrangement to form current mirrors which set the low and high current levels for the low loop bandwidth and high loop bandwidth phase lock loop states, respectively. The numbers shown alongside each of the MOSFET transistors represent their respective width over length ratios. The combination of MOSFET transistors 220, 222, 224, and 226 are coupled in tandem between the battery supply VDD and ground to effect a bias current I1 for the current mirrors of the current sourcing stages. The value of the sourcing bias current I1 is set by a bias voltage NBIAS provided over signal line 48 (see FIG. 1) and applied to the gate of the transistor 224.

Similarly, a tandem arrangement of MOSFET transistors 28, 230, 232, and 234 coupled between the supply voltage VDD and ground effects a bias current I2 for the current sinking mirror circuits. Moreover, the value of the bias current I2 is set by a bias voltage PBIAS provided over signal line 50 (see FIG. 1) and applied to the gate of the transistor 230.

Still further, a voltage Vg1 is produced at the drain of the diode configured MOSFET transistor 222 and is coupled to the gates of two MOSFET transistors 236 and 238 to produce a current mirroring effect thereat. That is, the sourcing current level conducted through transistor 236 is an amplification of the bias current I1 based on the width to length ratios (gain relationship) of the transistors 222 and 236. In the present embodiment, this ratio was set at a value of 8 (low loop bandwidth state). Similarly, the sourcing current level conducted through the transistor 238 is also an amplification of the bias current I1 for the same reasons, and for the present embodiment, the amplification was set at 400 (high loop bandwidth state).

In the same manner, a voltage Vg2 is effected at the source of the diode configured MOSFET transistor 232 in accordance with the value of the bias current I2. The voltage signal Vg2 is coupled to the gates of two MOSFET transistors 240 and 242 to produce the current mirroring effects (gain relationship) for the sinking current levels in both the low loop bandwidth and high loop bandwidth states as that described above for the transistors 236 and 238. For the present embodiment, the amplification settings for the transistors 240 and 242 are substantially the same as those set for transistors 236 and 238, respectively.

MOSFET transistors 244 and 246 are coupled between the transistors 236 and 238, respectively, and the voltage supply VDD. The switches 244 and 246 are controlled by the respective signals NLBW and NHBW to conduct and not conduct low and high level sourcing current through the transistors 236 and 238, respectively. Hereinafter, the coupled transistor pair 236 and 244 will be referred to as SW1 and the coupled pair of transistors 238 and 246 will be referred to as SW2. In a similar manner, the MOSFET transistors 248 and 250 are coupled between their respective transistors 240 and 242 and ground potential. The transistors 248 and 250 are controlled by the signals LBW and HBW to conduct and not conduct low and high level sinking current through their respectively coupled transistors 240 and 242. Hereinafter, the coupled pairs 240, 248 and 242, 250 will be referred to as SW3 and SW4, respectively.

In operation, in a low loop bandwidth state, source current may be supplied to or drained from the capacitive element 52 via signal line 54 through SW1 and SW3 as controlled by the signals NLBW and LBW, respectively. On the other hand, in a high loop bandwidth state, sourcing current is supplied through both SW1 and SW2 and sinking current is conducted through SW3 and SW4 as controlled by the signals NHBW and HBW, respectively. For the present embodiment, the design is such that when both signals NHBW and NLBW are both logical 1's and signals LBW and HBW are both logical 0, all of the switches SW1, SW2, SW3, and SW4 are off, creating a floating state at the conduction line 54. This floating state may be created during a sleep cycle of the battery saving signal BATS in order to maintain the voltage across the capacitive element 28.

More specifically, referring to FIG. 5A, when the battery saving signal BATS is at a logical 0 state which represents a sleep cycle thereof, the flip-flops 184 and 186 are reset which sets the signals $\overline{Q1}$ and $\overline{Q2}$ to a logical 1. In response, the output of NAND gate 202 is effected to a logical 0 (i.e. the ON signal is set to logical 0) which disables the NAND gates 192 and 194 effecting a logical 1 at the outputs thereof. This results in a logical 1 and a logical 0 over the control signals NLBW and LBW, respectively, which turns switches SW1 and SW3 off and also results in a logical 1 and logical 0 for the signals NHBW and HBW, respectively, which also turns switches SW2 and SW4 off. Accordingly, with all of these switches off, the charging circuit 46 is inhibited from adjusting the voltage across the capacitive element 28 which state continues for the duration of the sleep cycle of the battery saving signal BATS. Conversely, when the battery saving signal BATS is changed to a logical 1 representative of the commencement of an awake cycle, the NAND gates 192 and 194 are enabled to thereafter respond to their respective control signals NPU and NPD (see FIG. 5A).

The remaining operations of the charging circuit 46 which are controlled by the control signals NPU and NPD, the data signals Q1, Q2, and the autobandwidth signal (A) in a selectable one of either the low or high loop bandwidth states is defined for the present embodiment by the truth table 1 provided directly here below.

TRUTH TABLE 1

| A | Q1 | Q2 | NPU | NPD | LBW | HBW | NLBW | NHBW | SW1 | SW2 | SW3 | SW4 |
|---|----|----|-----|-----|-----|-----|------|------|-----|-----|-----|-----|
| X | 1 | 0 | 1 | 0 | 1 | 1 | 1 | 1 | OFF | OFF | ON | ON |
| X | 0 | X | 1 | 0 | 1 | 0 | 1 | 1 | OFF | OFF | ON | OFF |
| 1 | 1 | 1 | 1 | 0 | 1 | 1 | 1 | 1 | OFF | OFF | ON | ON |
| 0 | 1 | 1 | 1 | 0 | 1 | 0 | 1 | 1 | OFF | OFF | ON | OFF |
| X | 1 | 0 | 0 | 1 | 0 | 0 | 0 | 0 | ON | ON | OFF | OFF |
| X | 0 | X | 0 | 1 | 0 | 0 | 0 | 1 | ON | OFF | OFF | OFF |
| 1 | 1 | 1 | 0 | 1 | 0 | 0 | 0 | 0 | ON | ON | OFF | OFF |
| 0 | 1 | 1 | 0 | 1 | 0 | 0 | 0 | 1 | ON | OFF | OFF | OFF |

Note that autobandwidth control is operational when both Q1 and Q2 are logical 1's, otherwise, the programmed code of Q1 and Q2 may be alternatively used to set the state of the loop bandwidth.

To summarize, the frequency synthesizer including a phase lock loop 10 is governed by a frequency channel setting N and/or K to generate a synthesized frequency signal SF. The loop 10 is selectively operative in a low or high loop bandwidth state utilizing either the programmed 2-bit code 52 of the digital word stored in register 22 or the autobandwidth signal AUTBW effected by the phase detector circuit 16 as described in connection with the embodiment of FIG. 2 hereabove.

More specifically, the phase detector circuit 16 is governed by the reference FR and feedback FV frequency signals to generate at least one control signal NPU and/or NPD based on the phase difference between the FR and FV signals. Each of the FR and FV signals include one phase indication per frequency period. The control signals NPU and NPD control the sourcing and sinking of current by the charging circuit 46 to adjust the voltage across capacitive element 28 which is utilized to adjust the frequency of the signal SF.

In the present embodiment, a portion of the phase detector circuit 16 includes an autobandwidth control circuit which controls, via autobandwidth signal AUTBW, (1) the switching of the loop bandwidth from the low to the high loop bandwidth state based on an initial occurrence of at least three successive phase indications of a selected one of the FR and FV frequency signals between successive phase indications of the other frequency signal; and (2) the switching back from the high to the low loop bandwidth state based on an initial occurrence of two successive phase indications of the other frequency signal between successive phase indications of the selected frequency signal. As described in connection with the embodiment of FIGS. 5A and 5B, the autobandwidth signal governs the logic states of the control signals NLBW, NHBW, LBW, and HBW which alter loop bandwidth through switches SW1 through SW4 (see Truth Table 1, supra).

While the present invention has been described hereabove in connection with a particular embodiment depicted in FIGS. 1-5B, it is understood that modifications, additions, and substitutions may be made to the embodiment without deviating from the broad principles of the present invention. Accordingly, the present invention should not be limited to that described for any single embodiment, but rather construed in accordance with the broad scope and breadth of the recitation of the appended claims.

What is claimed is:

1. A frequency synthesizer governed by a frequency channel setting to generate a synthesized frequency signal, said frequency synthesizer including a phase lock loop (PLL) circuit operative in a first loop bandwidth state to maintain said synthesized frequency signal substantially at said frequency channel setting, said PLL circuit settable to a new frequency channel setting, said PLL circuit operative in a second loop bandwidth state to converge the synthesized frequency signal to said new frequency channel setting, said PLL circuit comprising:

phase detecting means governed by a reference frequency signal and a feedback frequency signal to generate at least one control signal based on said reference and feedback frequency signals, each of said reference and feedback frequency signals including one phase indication per frequency period, said feedback frequency signal being phase and frequency representative of said synthesized frequency signal, said at least one control signal for adjusting the frequency of the synthesized frequency signal; and autobandwidth control means for controlling the switching from said first to said second loop bandwidth state based on an initial occurrence of three successive phase indications of a selected one of the reference and feedback frequency signals between successive phase indications of the other of the reference and feedback frequency signals, and for controlling the switching back from said second to said first loop bandwidth state based on an initial occurrence of two successive phase indications of the other frequency signal between successive phase indications of the selected frequency signal.

2. The frequency synthesizer in accordance with claim 1 wherein the autobandwidth control means includes means for counting the phase indications of a selected one of the reference and feedback frequency signals.

3. The frequency synthesizer in accordance with claim 2 wherein the phase detector means includes means governed by the reference and feedback frequency signals to generate first and second control signals for increasing and decreasing the frequency of the synthesized frequency signal, respectively; and wherein the autobandwidth control means includes means governed by said first and second control signals to select one of the reference and feedback frequency signals for use in counting phase indications by said counting means.

4. The frequency synthesizer in accordance with claim 3 wherein the counting means includes:
first means governed by the second control signal to enable the counting of the phase indications of the reference frequency signal; and
second means governed by the first control signal to enable the counting of the phase indications of the feedback frequency signal.

5. The frequency synthesizer in accordance with claim 2 including decoder means for detecting when said counting means reaches a count of three greater than an initial count and for generating a detect signal in response to said detection; logic means responsive to said detect signal to cause switching from the first to the second loop bandwidth state.

6. The frequency synthesizer in accordance with claim 5 including means for resetting the counting means to an initial count based on the occurrence of a phase indication of the non-selected one of the reference and feedback frequency signals prior to the generation of the detect signal.

7. The frequency synthesizer in accordance with claim 5 wherein the logic means is responsive to the detect signal to inhibit further counting by said counting means.

8. The frequency synthesizer in accordance with claim 5 including means for detecting the occurrence of two successive phase indications of the non-selected frequency signal prior to a phase indication of the selected frequency signal and for generating a second detect signal in response to said detection; and wherein the logic means is responsive to said second detect signal to cause switching from the second to the first loop bandwidth state.

9. The frequency synthesizer in accordance with claim 8 including means for resetting the counting means to an initial count based on the occurrence of the second detect signal.

10. A method of operating a phase lock loop circuit of a frequency synthesizer in a selected one of first and second loop bandwidth states to generate a synthesized frequency signal as governed by a frequency channel setting, said method comprising the steps of:
operating the phase lock loop circuit in a first loop bandwidth state to maintain the synthesized frequency signal substantially at the frequency channel setting;
operating the phase lock loop circuit in a second loop bandwidth state to converge the synthesized frequency signal to a new frequency channel setting;
generating at least one control signal based on a reference frequency signal and a feedback frequency signal, each of said reference and feedback frequency signals including one phase indication per frequency period, said feedback frequency signal being phase and frequency representative of the synthesized frequency signal;
adjusting the frequency of the synthesized frequency signal with said at least one control signal;
switching from said first to said second loop bandwidth state based on an initial occurrence of three successive phase indications of a selected one of the reference and feedback frequency signals between successive phase indications of the other of the reference and feedback frequency signals; and
switching back from said second to said first loop bandwidth state based on an initial occurrence of two successive phase indications of the other frequency signal between successive phase indications of the selected frequency signal.

11. The method in accordance with claim 10 including the step of counting the phase indications of a selected one of the reference and feedback frequency signals as governed by the at least one control signal.

12. The method in accordance with claim 11 including the steps of:
generating first and second control signals for increasing and decreasing the frequency of the synthesized frequency signal, respectively, as governed by the reference and feedback frequency signals; and
selecting one of the reference and feedback frequency signals for use in counting phase indications as governed by the first and second control signals.

13. The method in accordance with claim 12 wherein the step of counting further includes the steps of:
enabling the counting of the phase indications of the reference frequency signal by the second control signal; and
enabling the counting of the phase indications of the feedback frequency signal by the first control signal.

14. The method in accordance with claim 11 including the steps of:
detecting when the step of counting reaches a count of three greater than an initial count and generating a detect signal in response to said detection; and
causing the switching from the first to the second loop bandwidth state in response to the detect signal.

15. The method in accordance with claim 14 including the step of resetting the count of the counting step to an initial count based on the occurrence of a phase indication of the non-selected one of the reference and feedback frequency signals prior to the generation of the detect signal.

16. The method in accordance with claim 14 wherein the step of counting is inhibited from further counting phase indications in response to the detect signal.

17. The method in accordance with claim 14 including the steps of:
   detecting the occurrence of two successive phase indications of the non-selected frequency signal prior to a phase indication of the selected frequency signal and generating a second detect signal in response to said detection; and
   causing the switching from the second to the first loop bandwidth state in response to the second detect signal.

18. The method in accordance with claim 17 including the step of resetting the count of the counting step to an initial count based on the occurrence of the second detect signal.

* * * * *